(12) United States Patent
Ray et al.

(10) Patent No.: US 6,558,872 B1
(45) Date of Patent: May 6, 2003

(54) RELATION TO THE MANUFACTURE OF MASKS AND ELECTRONIC PARTS

(75) Inventors: Kevin Barry Ray, Castleford (GB);
Anthony Paul Kitson, Leeds (GB);
Eduard Kottmair, Ebenhausen (DE);
Hans-Horst Glatt, Munich (DE);
Stefan Hilgart, Munich (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 108 days.

(21) Appl. No.: 09/658,548

(22) Filed: Sep. 9, 2000

(51) Int. Cl.$^7$ ............. G03C 1/52; G03C 1/60; G03C 1/695; G03C 1/76; G03C 1/77; G03C 1/73

(52) U.S. Cl. ............. 430/271.1; 430/165; 430/166; 430/190; 430/193; 430/272.1; 430/275.1; 430/277.1; 430/278.1; 430/279.1; 430/944; 430/905; 430/281.1; 430/287.1; 430/311; 430/326

(58) Field of Search ............. 430/271.1, 272.1, 430/275.1, 277.1, 278.1, 279.1, 905, 944, 311, 326, 281.1, 287.1, 165, 166, 190, 193

(56) References Cited

U.S. PATENT DOCUMENTS

| | | | |
|---|---|---|---|
| 4,619,990 A | 10/1986 | Elmasry | 534/573 |
| 4,680,375 A | 7/1987 | Elmasry | 528/253 |
| 6,063,544 A | 5/2000 | Sheriff et al. | 430/271.1 |
| 6,124,425 A | 9/2000 | Nguyen | 528/422 |
| 6,177,182 B1 * | 1/2001 | Nguyen | 428/319.3 |

FOREIGN PATENT DOCUMENTS

| | | |
|---|---|---|
| EP | 825927 | 3/1998 |
| EP | 864419 | 9/1998 |
| GB | 1245924 | 9/1971 |
| WO | WO 9901795 | 1/1999 |
| WO | 9908879 | 2/1999 |
| WO | WO9908879 | 2/1999 |

OTHER PUBLICATIONS

Reactive Azo Dyes in "Color Chemistry", H. Zollinger, $2^{nd}$ Edition, pp. 167–169, VCH Verlag Weinheim, New York 1991.

L. Strekowski, M. Lipowska, G. Patonay, J. Org. Chem., 1992, 57, pp. 4578–4580.

Y.L. Slaminski, I.D. Radchenko, A.I. Tolmachev, J. Org. Chem. USSR, 1979, 15, pp. 351–356.

* cited by examiner

Primary Examiner—Janet Baxter
Assistant Examiner—Sin J. Lee
(74) Attorney, Agent, or Firm—Faegre & Benson, LLP

(57) ABSTRACT

Imagable precursors for masks and for electronic parts comprise a polymeric layer applied to a substrate. The layer comprises at least one polymer having infra-red absorbing groups carried as pendent groups on the polymer backbone. Certain infra-red absorbing groups may also act to insolubilize the polymer in a developer, until it is imagewise exposed to infra-red radiation. Imagewise application of heat, resulting from imagewise exposure of the precursor to infra-red radiation, renders the polymer layer more soluble in the developer than prior to exposure to the infra-red radiation.

12 Claims, 1 Drawing Sheet

— co-reacted dye/polymer

-x—x—x- admixed dye/polymer

//RELATION TO THE MANUFACTURE OF MASKS AND ELECTRONIC PARTS

BACKGROUND OF THE INVENTION

1. Field of the Invention

This invention relates to positive working precursors for masks and electronic parts and to methods of making such precursors using imagable compositions, and to masks and electronic parts made using such precursors. More particularly, this invention is directed to a thermal, positive working precursor for masks and electronic parts, wherein the precursor comprises a substrate having a layer comprising a film forming polymer which has at least one pendent IR-absorbing group, the layer is less soluble in a developer solution prior to exposure to IR radiation, and the layer is more soluble in the developer after exposure to IR radiation.

2. Background Information

WO 99/08879 describes certain thermally imagable compositions, and their use as imagable coatings on masks and on precursors for printed circuits and other electronic parts. They comprise polymeric materials admixed with compounds which inhibit the dissolution of the polymeric materials in a developer, that inhibition being removed by heat. Preferably the coatings include infra-red absorbing compounds, and the beat is produced by infra-red radiation, acting upon the infra-red absorbing compounds.

The technology described above is effective, but the need for a plurality of compounds has some implications for manufacturing and storage. Errors may occur in manufacturing, leading to products which are not optimal, or which are not wholly consistent, from batch to batch. After manufacture, there is a possibility that migration of separate components, for example the infra-red absorbing compounds, can occur. Furthermore often a substantial amount of infra-red absorbing compound is needed in order to absorb sufficient infra-red radiation to generate the heat to obtain good imaging, and those infra-red absorbing compounds, especially infra-red absorbing dyes, can be very expensive.

Accordingly, there remains a need for technological advances in relation to thermally imagable articles for use in mask and electronic part manufacture; and in particular there remains a need for articles which have a coating which is inexpensive to produce and is of good imaging forming characteristics.

The types of electronic parts whose manufacture may use an imagable coating include printed circuit wiring boards (PWBs), thick- and thin-film circuits, comprising passive elements such as resistors, capacitors and inductors; multichip devices (MDCs); integrated circuits (ICs); and active semiconductor devices. The electronic parts may suitably comprise conductors, for example copper board; semiconductors, for example silicon or germanium; and insulators, for example silica as a surface layer with silicon beneath, with the silica being selectively etched away to expose portions of the silicon beneath (a step in the manufacture of eg field effect transistors). In relation to masks, a required pattern may be formed in the coating on the mask precursor, which is then used as a mask in a later processing step, in forming a patter on, for example, a printing or electronic part substrate.

SUMMARY OF THE INVENTION

The present invention provides a positive working mask precursor or electronic part precursor having a layer including a film-forming polymer, on a substrate. The polymer of this invention has at least one pendent infra-red absorbing group. The layer initially has a first (i.e. lower) solubility prior to exposure to IR radiation. This first solubility is such that the layer does not readily dissolve in a developer liquid. However, when the layer is subjected to infra-red radiation, the layer acquires a second (i.e. higher) solubility, such that the layer more readily dissolves in the developer liquid compared to when the layer has the first solubility. In one preferred embodiment, the polymer has functional groups independently selected from —SONHR, —NHR, —SH and —OH, where R is H or a $C_1$–$C_4$ alkyl group, and the polymer additionally has pendent groups which absorb infra-red radiation, such as polymethine dye and cyanine dye residues. The polymer may be prepared by reacting a parent polymer with an infra-red absorbing compound.

The present invention also provides a method of making an electronic part or mask of this invention, by a method which comprises: (a) providing the above-described precursor; (b) via IR radiation, imagewise exposing areas of the thermally imagable layer carried by the substrate; and (c) contacting the precursor with a developer liquid to selectively remove the exposed areas of the layer.

DETAILED DESCRIPTION OF THE INVENTION

Figure 1:
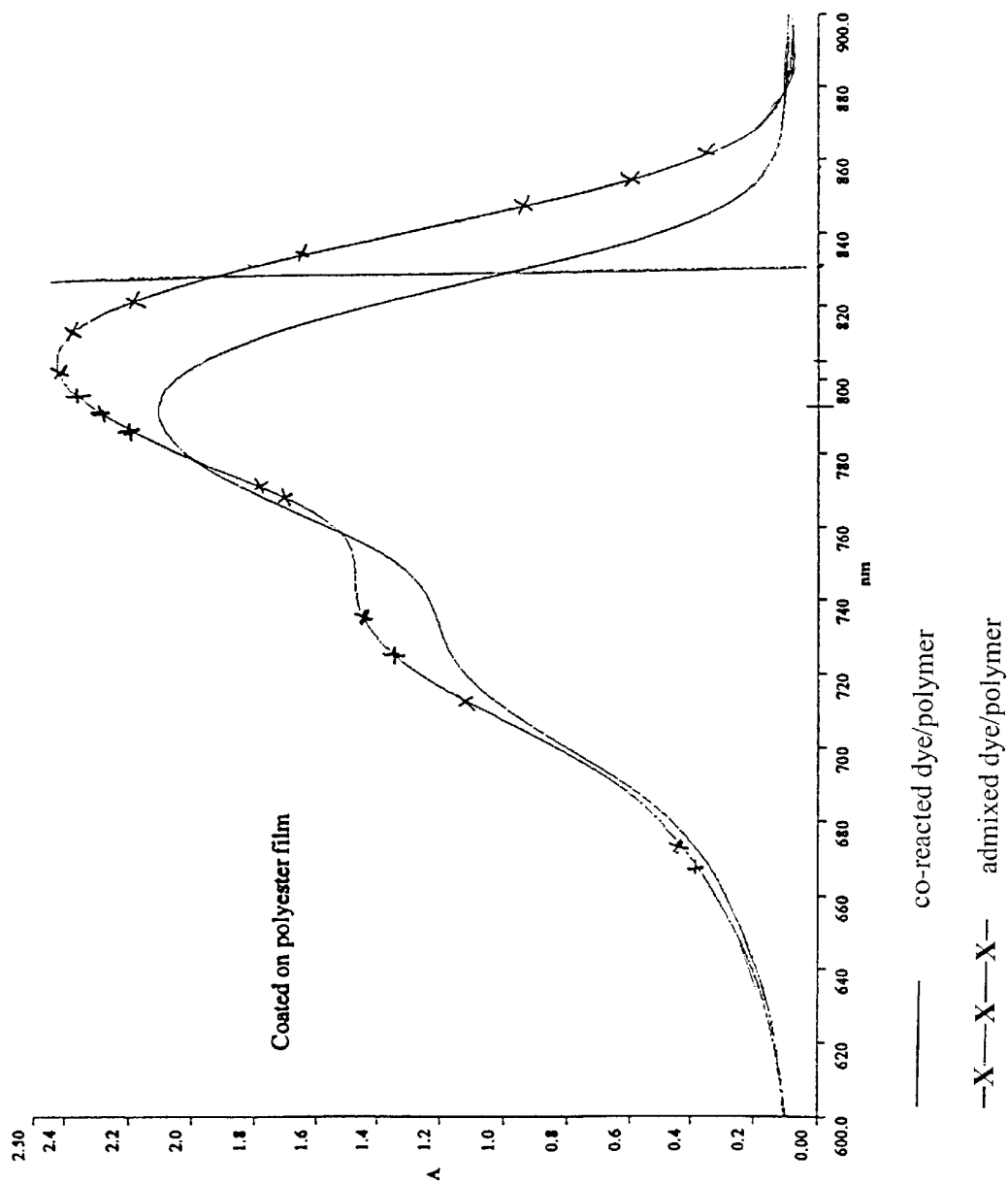
FIG. 1 sets forth the absorption profiles as described for Example 11.

It has been found that a polymer may be manufactured which itself is capable of absorbing infra-red radiation, to generate the heat required to alter its solubility in a developer liquid from a first solubility wherein the polymer is less soluble in a developer liquid to a second solubility wherein the same polymer is more soluble in the developer liquid in comparison with when the polymer has the first solubility. It has been determined that such a polymer may have some useful further properties which could not have been predicted. Such a polymer has pendent infra-red absorbing groups, the polymer having the property that it does not readily dissolve in a developer liquid when it has a first solubility, with the proviso that when subjected to infra-red radiation which is absorbed by the infra-red absorbing groups to produce heat, the same polymer acquires a second solubility replacing the first solubility and the polymer thereby more readily dissolves in the developer liquid. Such a polymer is referred to herein as an "infra-red absorbing polymer."

An infra-red absorbing polymer may absorb infra-red radiation efficiently and convert it to heat even at a very low loading of the infra-red absorbing species, compared with corresponding admixed compositions. Furthermore there is a blue shift in the maximum absorbency of the infra-red absorbing polymer, as loading of the infra-red species increases. This shift can be harnessed. Dyes which as admixed species could not be used with a given radiation source may now be useful, when carried as part of an infra-red absorbing polymer.

Preferably the parent polymer (that is, the corresponding polymer without any pendent groups) has nucleophilic groups Y, able to react with an infra-red absorbing compound, having a halogen atom, for example a chlorine atom. Preferably the parent polymer has groups Y selected from —$SO_2NHR$, —NHR, —SH and —OH, where R represents a hydrogen atom or a $C_{1-4}$ alkyl group, for example a methyl group. Preferably R represents a hydrogen atom. More preferably the parent polymer has sulfonamido groups or hydroxyl groups Y, or both.

Since it is unlikely or undesirable, or both, that all such groups of the parent polymer are functionalized by the reaction, preferably the infra-red absorbing polymer also has such groups Y. Most preferably, the parent polymer has hydroxyl groups Y.

A hydroxyl group-containing polymer may comprise a phenolic resin or co-polymer thereof. Particularly useful phenolic resins in this invention are the condensation products from the interaction between phenol, C-alkyl substituted phenols (such as cresols and p-tert-butyl-phenol), diphenols (such as bisphenol-A) and aldehydes and ketones (such as formaldehyde and acetone). Depending on the preparation route for the condensation a range of phenolic materials with varying structures and properties can be formed, as will be well understood to those skilled in the art. One useful class is pyrogallol/acetone condensates. Particularly useful in this invention are novolak resins, resole resins and novolak/resole resin mixtures. Most preferred are novolak resins. Examples of suitable novolak resins have the following general structure:

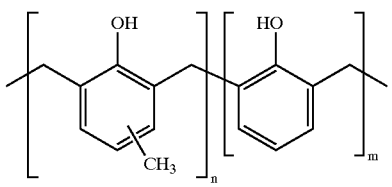

where the ratio of n:m is in the range of 1:20 to 20:1, say 1:3 to 3:1. In one preferred embodiment, n=m. However, in certain embodiments n or m may be zero. Novolak resins suitable for use have a molecular weight in the range of about 500–20,000, preferably in the range of about 1000–15,000, say about 2500–10,000.

Novolak resins useful in this invention are suitably condensation reaction products between appropriate phenols, for example phenol itself, C-alkyl substituted phenols (including cresols, xylenols, p-tert-butyl-phenol, p-phenylphenol and nonyl phenols), diphenols (e.g. bisphenol-A (2,2-bis(4-hydroxyphenyl)propane)), and appropriate aldehydes, for example formaldehyde, chloral, acetaldehyde and furfuraldehyde. As will be well understood by those skilled in the art, the type of catalyst and the molar ratio of the reactants used in the preparation of phenolic resins determines their molecular structure and therefore the physical properties of the resin. An aldehyde: phenol ratio between 0.5:1 and 1:1, preferably 0.5:1 to 0.8:1 and an acid catalyst is typically used to prepare novolak resins, which are thermoplastic in character. Higher aldehyde:phenol ratios of more then 1:1 to 3:1, and a basic catalyst, give rise to resole resins, and these are characterised by their ability to be thermally hardened at elevated temperatures.

The hydroxyl group-containing polymer may comprise a polyhydroxystyrene resin or co-polymer thereof, of general formula:

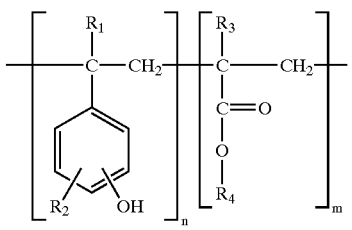

wherein $R_1$ represents a hydrogen atom or alkyl group, $R_2$ represents a hydrogen atom or alkyl group, $R_3$ represents a hydrogen atom or alkyl group, $R_4$ is an alkyl or hydroxyalkyl group, and the ratio n/m is in the range 10/0 to 1/10.

In general terms, any alkyl group is suitably a $C_{1-12}$ alkyl group, preferably a $C_{1-6}$ alkyl group, especially a $C_{1-4}$ alkyl group. An alkyl group may be branched (for example t-butyl) or straight chain (for example n-butyl).

$R_1$ preferably represents a hydrogen atom or a $C_{1-4}$ alkyl group, especially a methyl group. Most preferably $R_1$ represents a hydrogen atom.

$R_2$ preferably represents a hydrogen atom or a $C_{1-4}$ alkyl group, especially a methyl group. Most preferably $R_2$ represents a hydrogen atom.

The hydroxy substituent of the phenyl group shown is preferably located para to the linkage of the phenyl group to the polymer backbone.

$R_3$ preferably represents a hydrogen atom or a $C_{1-4}$ alkyl group, especially a methyl group. Most preferably $R_3$ represents a hydrogen atom.

$R_4$ preferably represents a $C_{1-6}$ alkyl or $C_{1-6}$ hydroxyalkyl group. When it represents a hydroxyalkyl group the hydroxy group is preferably carried by the terminal carbon atom of the alkyl group. Examples of suitable groups $R_4$ are —$CH_3$, —$CH_2CH_2OH$, and —$CH_2CH_2CH_2CH_3$.

Preferably the ratio n/m is in the range 10/1 to 1/10, preferably 5/1 to 1/2. More preferably the ratio n/m is in the range 2/1 to 2/3. Most preferably the ratio n/m is in the range 3/2 to 2/3, especially 1/1.

The weight average molecular weight Mw of the polyhydroxystyrene polymer drawn above, as measured by gel permeation chromatography, is preferably in the range 5,000–75,000, especially 7,000–50,000. The number average molecular weight Mn of the polymer is preferably in the range 2,000–20,000, especially 3,000–8,000.

The infra-red absorbing polymer may be prepared from the parent polymer by reaction between the infra-red absorbing compound, having a reactive halogen atom, and the parent polymer, under standard conditions to promote the required dehydrohalogenation. Typically alkaline dehydrohalogenation will be effective, at an elevated temperature, suitably under reflux. For example, the infra-red absorbing polymer may be prepared by reacting an appropriate parent polymer with a dye having a labile halogen atom, under alkaline conditions at an elevated temperature, to promote dehydrohalogenation. The same method may be used to introduce other pendent groups of the type previously described, in embodiments in which such groups are present.

Preferably the reaction is carried out such that nucleophilic groups Y remain. After reaction the number ratio of remaining nucleophilic groups Y to infra-red absorbing groups X, in the resultant infra-red absorbing polymer, is suitably at least 2:1, preferably at least 5:1, more preferably at least 10:1. Suitably the ratio does not exceed 100:1. Preferably it does not exceed 50:1. Most preferably it does not exceed 40:1.

The layer is preferably such that incident UV radiation does not increase its dissolution rate in a developer liquid.

The layer is preferably such that on thermal imaging it does not undergo an irreversible chemical change. Without wishing to be bound by any one theory, it is believed that preferred layers are those in which a complex is merely disrupted by heat.

The infra-red absorbing groups are preferably such that in exposure methods the polymer may be exposed by means of electromagnetic radiation of wavelength above 600 nm, and especially above 700 nm. Suitably it can be exposed by radiation of wavelength below 1400 nm, preferably below 1200 nm. Preferably it may not be exposed in any practicable manner outside these ranges. In a particularly preferred embodiment, the infra-red absorbing groups employed in the polymer of this invention have an electromagnetic radiation absorption maximum in the range of about 700 nm to about 1200 nm. The intensity of the infra-red radiation used in this invention will be understood by those skilled in the art to be the intensity necessary to cause the infra-red absorbing groups of the polymer to generate heat upon exposure to the infra-red radiation. Preferably, the intensity of the infra-red radiation is at least about $0.0$ $mW/\mu m^2$, more preferably at least $0.1$ $mW/\mu m^2$. It will be understood by those skilled in the art that the intensity may be greater than these minimum values, so long as the intensity is below the level capable of causing destruction of heated regions of the layer by the process of ablation.

Preferably, the imaging of the invention employs a laser for the exposure step. Examples of lasers which can be used include semiconductor diode lasers emitting at between 600 nm and 1400 nm, especially between 700 nm and 1200 nm. Examples are the Nd YAG laser which emits at 1064 nm and the diode laser imagesetter sold by Creo under the trade mark TRENDSETTER, which emits at 830 nm, but any laser of sufficient imaging power and whose radiation is absorbed by the layer may be used.

Preferably the infra-red absorbing groups have an absorption spectrum such that absorption is significant at the wavelength output of the radiation source, preferably a laser source, which is to be used in the patternwise exposure of precursors of the present invention.

Preferably a layer solely of the parent polymer dissolves readily in a developer liquid. Thus, in the present invention the parent polymer is made less soluble by use of a dissolution inhibitor.

One way to inhibit the dissolution of the parent polymer (i.e. make the parent polymer less soluble) in a developer is to include suitable functional groups on the polymer. Functional groups which insolubilize the infra-red absorbing polymer may include pendent functional groups carried by the polymer, additional to the infra-red absorbing groups. Suitable functional groups include those described in WO 99/01795, the contents of which are hereby incorporated in this specification by reference. Preferred groups are —O—SO$_2$-tolyl, —O-dansyl, —O—SO$_2$-thienyl, —O—SO$_2$-naphthyl and —O—CO—Ph.

Alternatively or additionally diazide functional groups may be carried by the polymer. When diazide groups are used in this invention, either in separate compounds admixed with the infra-red absorbing polymer or as functional groups on the infra-red absorbing polymer, as described above, they preferably comprise diazo groups (=N$_2$), preferably conjugated to carbonyl groups, preferably via an aromatic or heteroaromatic ring.

In such moieties a carbonyl group is preferably bonded to the aromatic or heteroaromatic ring at an adjacent ring position to the diazo group. Preferred moieties are o-benzoquinonediazide (BQD) moieties (often referred to as o-quinonediazides) and o-naphthoquinonediazide (NQD) moieties.

A BQD moiety may, for example, comprise the 1,4- or, preferably 1,2-benzoquinonediazide moiety. An NQD moiety may, for example comprise the 1,4-, 2,1-or, most preferably, the 1,2-naphthoquinone diazide moiety. Generally, NQD moieties are preferred to BQD moieties, when diazide groups are used in the practice of the invention. The most preferred diazide moiety for use in the practice of this invention is the 1,2-naphthoquinonediazide moiety.

Dissolution inhibitors may include the infra-red absorbing groups themselves. Thus, an infra-red absorbing polymer of the invention may comprise functional groups X which act to inhibit the dissolution of the infra-red absorbing polymer compared with the parent polymer, to absorb infra-red radiation and thereby yield heat, and to permit the infra-red absorbing polymer to dissolve in the developer liquid, where thus heated.

Preferred functional groups X, performing all of these functions described in the previous paragraph, are residues of infrared absorbing dyes, preferably polymethine dyes, more preferably cyanine dyes. One definition of a cyanine dye, as disclosed in Hawley's Condensed Chemical Dictionary (12$^{th}$ edition) (Van Nostrand Reinhold 1993), is a dye consisting of two heterocyclic groups connected by a chain of conjugated double bonds containing an odd number of carbon atoms. The definition includes isocyanines, merocyanines, cryptocyanines, phthalocyanines and dicyanines.

In the embodiments just described the infra-red absorbing polymer itself has the property that the polymer has a first (i.e. lower) solubility in the developer liquid prior to heating and a second (i.e. higher) solubility in the developer liquid once heated. In other embodiments the infra-red absorbing polymer on its own may or may not have this property to any useful degree, but another compound is present in the layer, and confers this property on the layer, or supplements it, by inhibiting the dissolution of the layer in the developer liquid. Without wishing to be bound by any one theory, it is believed that a complex forms between such a compound and the infra-red absorbing polymer, the complex being disturbed by heat.

Thus, the dissolution of the infra-red absorbing polymer in a developer liquid may be inhibited by including a separate dissolution inhibition compound, acting upon and preferably, admixed with, the infra-red absorbing polymer. Suitable dissolution inhibition compounds are described, for example, in EP 825927B, the contents of which are incorporated in this specification by reference. In accordance with the disclosure of EP 825927B a dissolution inhibition compound may be present in an amount in the range 1–25%, preferably 2–15%, by weight of the composition.

A useful class of dissolution inhibition compounds are nitrogen containing compounds wherein at least one nitrogen atom is either quaternized or incorporated in a heterocyclic ring, or both quaternized and incorporated in a heterocyclic ring.

Examples of useful quaternized nitrogen containing compounds are triaryl methane dyes, for example Crystal Violet (CI basic violet 3), Victoria Blue and Ethyl Violet, and tetraalkyl ammonium compounds, for example Cetrimide. Preferably a separate dissolution inhibition compound is a nitrogen-containing heterocyclic compound. Examples of suitable nitrogen-containing heterocyclic compounds are quinoline and triazols, such as 1,2,4-triazol. Most preferably a dissolution inhibition compound is a quaternized heterocyclic compound. Examples of suitable quaternized heterocyclic compounds are imidazoline compounds, such as Monazoline C, Monazoline O, Monazoline CY and Monazoline T all of which are manufactured by Mona Industries, quinolinium compounds, such 1-ethyl-2-methyl quinolinium iodide and 1-ethyl-4-methyl quinolinium iodide, and benzothiazolium compounds, such as 3-ethyl-2-methyl benzothiazolium iodide, and pyridinium compounds, such as cetyl pyridinium bromide, ethyl viologen dibromide and fluoropyridinium tetrafluoroborate.

Usefully the quinolinium or benzothiazolium compounds are cationic cyanine dyes, such as Quinoldine Blue and 3-ethyl-2-[3-(3-ethyl-2(3H)-benzothiazolylidene)-2-methyl-1-propenyl]benzothiazolium iodide, and the compound of formula:

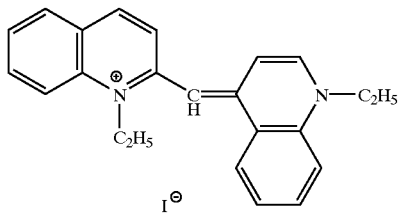

A further useful class of dissolution inhibition compounds are carbonyl functional group containing compounds. Examples of suitable carbonyl containing compounds are -naphthoflavone, -naphthoflavone, 2,3-diphenyl-1-indeneone, flavone, flavanone, xanthone, benzophenone, N-(4-bromobutyl)phthalimide and phenanthrenequinone.

A dissolution inhibition compound may be a compound of general formula:

where $Q_1$ represents an optionally substituted phenyl or alkyl group, q represents 0, 1 or 2, and $Q_2$ represents a halogen atom or any alkoxy group. Preferably $Q_1$ represents a $C_{1-4}$ alkyl phenyl group, for example a tolyl group, or a $C_{1-4}$ alkyl group. Preferably q represents 1 or, especially, 2. Preferably $Q_2$ represents a chlorine atom or a $C_{1-4}$ alkoxy group, especially an ethoxy group.

Another useful dissolution inhibition compound is acridine orange base (CI solvent orange 15). Other useful dissolution inhibition compounds are ferrocenium compounds, such as ferrocenium hexafluorophosphate.

Alternatively or additionally diazide group-containing compounds, admixed with infra-red absorbing polymer, may be employed.

The positive working precursor of the present invention comprises a substrate having a layer applied thereon, wherein the layer comprises at least one infra-red absorbing polymer. As discussed above with respect to the infra-red absorbing polymer itself, the layer has a first solubility in a given developer liquid prior to exposure to IR radiation, and a second solubility in the developer liquid after exposure to the IR radiation, wherein the second solubility in the developer liquid is greater than the first solubility. Accordingly, the IR-exposed regions of the layer may be easily dissolved in the developer solution.

In another embodiment a cover layer is provided to inhibit dissolution of the layer comprising the infra-red absorbing polymer. The cover layer acts as a physical barrier preventing the layer comprising the infra-red absorbing polymer from contact with the developer liquid. On exposure to infra-red radiation the heat generated by the infra-red absorbing polymer layer acts on the cover layer, which no longer acts as a barrier, but allows the developer liquid to contact the underlying infra-red absorbing polymer layer, in the heated areas.

The several dissolution inhibitors described herein are not mutually exclusive. One example of a polymer which has two distinct dissolution inhibitors is a polymer having functional groups X as described above and diazide groups.

In preferred embodiments it is preferred that the dissolution rate (i.e. solubility) of the layer containing the infra-red absorbing polymer in a developer is not increased by incident UV or visible radiation, thus making handling of the precursors straightforward. Preferably such layers do not comprise any UV or visible light sensitive components. However UV or visible light sensitive components which are not activated by UV or visible light due to the presence of other components, such as UV or visible light absorbing dyes or a UV or visible light-absorbing topmost layer, may in principle be present.

The substrate may be a semiconductor in which case the method may involve one or more subsequent doping steps selectively in regions in which the composition has been removed, such doping steps being for example by vapor phase, liquid immersion or by ion implantation methods. The substrate may also be an insulator which is etched to reveal a conductive or semiconductor layer below. For example the substrate may be silica etched to reveal silicon. Alternatively the substrate may be a conductive surface on which a wiring pattern is to be formed, for example by etching the printed circuit precursor in an etchant to remove said conductive surface selectively in the said regions.

The substrate may comprise a metal layer. Preferred metals include aluminum, zinc, titanium and copper, with copper being especially preferred.

However, the substrate of an electronic part precursor referred to herein is different from the substrate used for lithographic printing plates. In particular, in this embodiment the surface is not an aluminium plate which has undergone the usual anodic graining and post-anodic treatments well known in the lithographic art for enabling a radiation sensitive composition to be coated thereon and for the surface of the plate to function as a hydrophilic printing background; or other metallic substrate treated for use as a printing plate. More preferably when the surface is conductive it is a copper or a copper-rich alloy. Preferably such a surface is supported by an insulating substrate. The insulating substrate is suitably a dimensionally stable plastics board, for example of epoxy resin reinforced by glass fibres.

While the substrate defined herein may have a surface insulator which requires selective etching to remove portions thereof to reveal an electroactive layer beneath it, preferably the surface itself is an electroactive layer. By electroactive it is meant to be conveyed that a conductor, a semiconductor or a material which when doped functions as a semiconductor. Most preferably the surface is a conductor.

The invention may also be applied to the manufacture of masks. Masks are used in some imaging methods, whether in the context of printing or circuit board substrates, with the required resist pattern being formed in the coating on the mask precursor, which is then used as a mask or screen, in a later processing step. One example of such a process is the flexographic process. The invention may in particular be applied to the manufacture of masks requiring the removal of only a proportion of the full depth of the composite layer structure where heated, rather than the full depth thereof.

The heat-sensitive composite layer structures described herein may be coated onto a film, forming a mask precursor, and heat-imaged, and developed, to provide a mask. The mask precursor may be imaged to leave the composition thereon in different depths at different locations, after development. The resulting mask may then usefully be applied over a printing substrate and flood exposed, for example using a UV light source.

In accordance with the present invention a mask or an electronic part, whether a circuit or a circuit device, is obtained after heat-mode imaging and processing. On exposure to heat, preferably delivered by suitable radiation, the heated areas of the layer are rendered more soluble in the aqueous solution. Therefore on imagewise exposure there is a change in the solubility differential of the unexposed and of the exposed parts of the layer. Thus, in the exposed regions the layer is dissolved, preferably to the extent of revealing the underlying surface of the substrate. The revealed areas of the underlying surface can then be selectively subjected to a desired treatment, which in the case of electronic parts may entail etching, doping and/or deposition, and/or making electrical connections thereto. Desirably, after such treatment, the remaining areas of the layer are then removed. This may be achieved by heating the precursor to solubilize the remaining areas of the composition, then subjecting it to a developer; or, preferably, by subjecting it to a stripper liquid, for example acetone or strong alkali, for example an alkali metal hydroxide.

The precursors of the invention may be imaged with a laser or an array of lasers emitting infrared radiation in a wavelength region that closely matches the absorption spectrum of the first infrared absorbing layer. Suitable commercially available imaging devices include image setters such as a Creo Trendsetter (available from the Creo Corporation, British Columbia, Canada) and a Gerber Crescent 42T (available from the Gerber Corporation). Alternatively, the precursors of this invention may be imaged using an apparatus containing a thermal printing head or any other means for imagewise conductively heating the composite layer such as with a heated stylus.

The layer or layers described herein may additionally contain other ingredients such as polymeric particles, stabilizing additives, pigments and additional inert polymeric binders as are well known to be present in many positive working compositions.

As will be well understood by those skilled in the art, when it is stated herein that a layer readily dissolves it is meant that the layer dissolves in a selected developer at a selected temperature and in a selected period of time, to an extent useful in a mask or electronic part imaging and development process. When it is stated herein that the layer does not readily dissolve it is meant that the layer does not dissolve in the selected developer at a selected temperature and in a selected period of time, to an extent useful in such a process. When it is stated that the layer's dissolution rate is not increased by incident UV or visible radiation, it is meant that it is not substantially increased, that is, by an amount which would mean that in a normal working environment for such precursors, UV/visible safelighting would have to be employed. Thus, insubstantial increases in dissolution rate caused by UV or visible radiation, causing no significant effect on operation, or increases caused by artificially high levels of UV or visible radiation, which do not reflect practical handling conditions, do not fall within the terms of this definition.

Thus in preferred embodiments of this invention a mask or electronic part may be obtained after patternwise exposure and development of a positive working precursor. The dissolution rate (i.e. solubility) of the layer in the developer liquid after it has been subjected to heat during patternwise exposure to IR radiation is greater than the dissolution rate of the corresponding unexposed layer. Thus in the exposed areas the coating is preferentially dissolved, to form the required pattern.

In accordance with a third aspect of this invention there is provided a mask or electronic part prepared by steps including those of the method of the second aspect, as defined herein.

As will be well understood by those skilled in the art, the developer liquid is dependent on the nature of the layer (or layers) but is preferably an aqueous developer. Common components of aqueous developers are surfactants, chelating agents such as salts of ethylenediamine tetraacetic acid, organic solvents such as benzyl alcohol, and alkaline components such as inorganic metasilicates, organic metasilicates, hydroxides or bicarbonates.

Preferably the aqueous developer is an alkaline developer, suitably containing an organic or, preferably, an inorganic metasilicate, for example sodium metasilicate.

Preferred precursors of the invention are exclusively positive working. That is, they have no additional negative working capability.

The following examples more particularly serve to illustrate various embodiments of the present invention described hereinabove.

EXAMPLES

1. Starting Materials

The following products are referred to herein:

Resin A: Maruka Lyncur CBA—a copolymer of polyvinylphenol and butylacrylate having the structure:

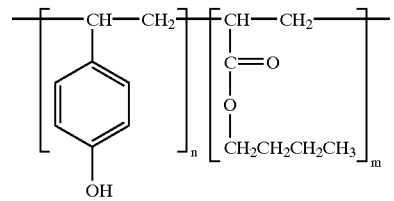

n/m=8/2–6/4, Mw=10,000–30,000
Mn=5,000–5,500 manufactured by Maruzen, Japan and available from Siber Hegner, Beckenham, UK.

Resin B: Maruka Lyncur M (S-4)—a polyvinylphenol, Mw=7,000–11,000, Mn=3,400–5,200, manufactured by Maruzen and available from Siber Hegner.

Resin C: LB 6564, a 1:1 phenol/cresol novolak resin available from Bakelite AG, Germany.

Resin D: Resin A capped with Dye B below, in proportions 121 g Resin A: 37.8 g Dye B.

Resin E: Resin B capped with Dye B below, in proportions 120 g Resin B: 37.8 g Dye B.

Resin F: Resin C capped with Dye A below, in proportions 126 g Resin C: 26.0 g Dye A.

Dye A—a dye known as KF 654B PINA, having the structure:

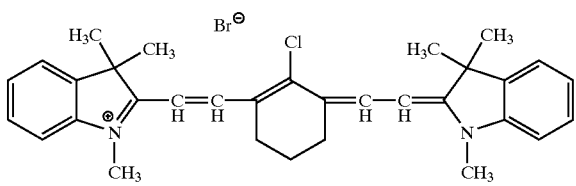

available from Riedel de Haan, Middlesex, UK.

Dye B—a dye having the structure:

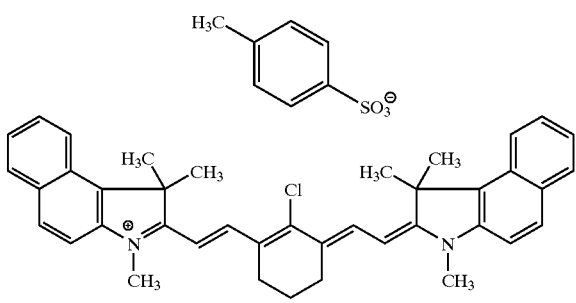

Dye C—Crystal Violet (basic violet 3, C.I. 42555) having the structure:

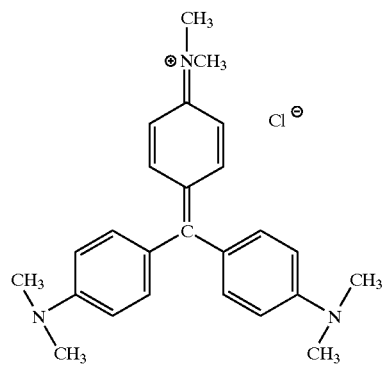

available from Aldrich Chemical Company of Dorset, UK.

Developer A: 1% wt sodium hydroxide in water.

Copper substrate A: double-sided copper laminate of overall thickness 254 microns, having copper cladding 18 microns thick on each side of an insulating substrate, catalogue number N4105-2, 0.008, H/H HTE, as supplied by New England Laminates (UK) Limited, of Skelmersdale, UK.

Polyester substrate: Planfoil polyester montage foil (0.18 mm thickness) as supplied by Kodak Polychrome Graphics, Leeds, UK.

In all cases the copper substrate was brush grained using a mechanical brush grainer, stock number 4428 (supplied by PCB Machinery Limited, Haslingden, UK), rinsed with distilled water for 10 seconds and allowed to air dry, followed by a rinse with citric acid (5% v/v in water) and a rinse with further distilled water, and an air dry, prior to coating.

Creo TRENDSETTER 3244—a commercially available plate setter, operating at a wavelength of 830 nm, as supplied by Creo Products of Burnaby, Canada.

Mathis labdryer oven—a drying oven available from Werner Mathis AG, Germany.

2. Polymer Modification

Solutions of the selected resin, Resin A, Resin B and Resin C, in ethanol, were treated with solid sodium hydroxide and, respectively, with Dye B, Dye B and Dye A. The mixtures were heated to boiling under reflux, typically for 30 minutes. The resultant capped resins, Resin D, Resin E and Resin F, were then isolated by precipitation into water and drying under vacuum.

3. Polymer Testing

In each example, imaging was carried out 1 day (which may be taken to mean 24 hours ±4 hours) after coating.

Examples C1–C3 and Examples 4–10

The coating formulations for Examples C1–C3 (comparative) and 4–10 below were prepared as solutions in 1-methoxypropan-2-ol. Dye C was present by admixture. The substrate used was copper substrate A. The coating solutions were coated onto one side of the substrate by means of a wire wound bar.

The solution concentrations were selected to provide the specified dry coating weights after thorough drying at 130° C. for 150 seconds, in a Mathis labdryer oven.

The compositions were as set out in the table below (amounts expressed w/w).

| | Examples | | | | | | | | | |
|---|---|---|---|---|---|---|---|---|---|---|
| Component | C1 | C2 | C3 | 4 | 5 | 6 | 7 | 8 | 9 | 10 |
| Resin A | 57.65 | 57.9 | 57.4 | 58.04 | 57.04 | 56.04 | 55.04 | 57.35 | 57.35 | 57.35 |
| Resin B | 40 | 40 | 40 | 40 | 40 | 40 | 40 | 40.05 | 39.05 | 38.05 |
| Dye A | 1.35 | 1.1 | 1.6 | | | | | | | |
| Dye C | 1 | 1 | 1 | 1 | 1 | 1 | 1 | 1 | 1 | 1 |
| Resin D | | | | 0.96 | 1.96 | 2.96 | 3.96 | | | |
| Resin E | | | | | | | | 1.6 | 2.6 | 3.6 |

Samples of the printed circuit board precursors (composition on copper substrate A at a dry coating weight of 4.0 g/m²) were imaged in the Trendsetter 3244, using a 50% checkerboard screen at 500 mJcm². The exposed precursors were then developed as follows. One sample was immersed in developer A at 20° C. until the imaged areas of the polymer layer had dissolved away. The time taken for dissolution was noted. Another sample was immersed in the same developer and the time taken to completely remove all the polymer layer (both exposed and unexposed areas) was measured. In this way a ratio of dissolution time of exposed and unexposed area was produced, as in the table below.

Samples of the coatings were also provided on the polyester substrate, at a dry coating weight of 2.4 g/m². The coated polyester substrates were then tested using a UV/vis spectrometer (Perkin Elmer Lambda 40 spectrometer, from Uberlingen, Germany), and the absorbance of each coating at 830 nm was measured.

| Example | Absorbance at 830 nm (polyester substrate) | Time to completely dissolve coating away in Developer A (seconds) (copper substrate) | Time to develop exposed coating away in Developer A (seconds) (copper substrate) | Dissolution ratio (copper substrate) |
|---|---|---|---|---|
| C1 | 0.23 | 170 | 50 | 3.4 |
| C2 | 0.18 | 150 | 45 | 3.3 |
| C3 | 0.26 | 190 | 60 | 3.2 |
| 4 | 0.10 | 90 | 40 | 2.3 |
| 5 | 0.21 | 95 | 35 | 2.7 |
| 6 | 0.35 | 115 | 35 | 3.3 |
| 7 | 0.47 | 130 | 45 | 2.9 |
| 8 | 0.15 | 85 | 30 | 2.8 |
| 9 | 0.26 | 95 | 30 | 3.2 |
| 10 | 0.36 | 105 | 35 | 3.0 |

The examples of the invention, i.e. Examples 4–10, exhibited good absorbance and dissolution ratio characteristics at very low loading of the infra-red absorbing species, compared with the comparative Examples C1–C3.

Example 11

Resin F was coated onto the polyester substrate, from a solution in 1-methoxypropan-2-ol. The solution concentration was selected to provide the specified dry film composition with a coating weight of 1 g/m² after thorough drying, at 130° C. for 150 seconds in the Mathis labdryer oven. The resultant precursor was placed in a UV/vis spectrometer (Perkin Elmer lambda 40 spectrometer, from Uberlingen, Germany) and the absorbance (A) of its coating at 830 nm was measured. The absorption profile is shown in FIG. 1, in solid line. The indicated line in FIG. 1 denotes a corresponding composition comprising Resin C admixed with Dye A, at a dye loading of 20% w/w on total weight of the composition, also coated onto the polyester substrate at a coating weight of 1 g/m².

It should be understood that various changes and modifications to the preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

The invention claimed is:

1. An electronic part precursor comprising a substrate and a layer applied to the substrate, wherein the layer comprises a film-forming polymer having at least one pendent infra-red absorbing group, wherein the layer has a first solubility in a developer liquid prior to exposure to infra-red radiation, and a second solubility in the developer liquid after exposure to infra-red radiation, and the second solubility is greater than the first solubility, wherein the film-forming polymer comprises further pendent groups which inhibit the dissolution of the polymer in the developer liquid, prior to exposure of the polymer to infra-red radiation, and wherein the further pendent groups comprise o-quinonediazide groups.

2. The precursor of claim 1, wherein the infra-red absorbing groups of the polymer themselves inhibit the dissolution of the polymer in the developer liquid, prior to exposure of the polymer to infra-red radiation.

3. The precursor of claim 1, wherein the polymer comprises hydroxyl groups.

4. The precursor of claim 1, wherein the layer is substantially insensitive to radiation of wavelength below 600 nm.

5. The precursor of claim 1, wherein the polymer has infra-red absorbing groups which are residues of polymethine dyes or cyanine dyes.

6. The precursor of claim 1, wherein the polymer comprises: (i) at least one functional group independently selected from —SO$_2$NHR, —NHR, —SH and —OH, where R represents a hydrogen atom or a C$_{1-4}$ alkyl group; and (ii) at least one pendent group which absorbs infra-red radiation.

7. An electronic part precursor comprising a substrate and a layer applied to the substrate, wherein the layer comprises a film-forming polymer having at least one pendent infra-red absorbing group, wherein the layer has a first solubility in a developer liquid prior to exposure to infra-red radiation, and a second solubility in the developer liquid after exposure to infra-red radiation, and the second solubility is greater than the first solubility, wherein the layer contains a dissolution inhibition compound admixed with the polymer that inhibits dissolution in the developer liquid prior to exposure of the polymer to infra-red radiation.

8. The precursor of claim 7, wherein the infra-red absorbing groups of the polymer themselves inhibit the dissolution of the polymer in the developer liquid, prior to exposure of the polymer to infra-red radiation.

9. The precursor of claim 7, wherein the polymer comprises hydroxyl groups.

10. The precursor of claim 7, wherein the layer is substantially insensitive to radiation of wavelength below 600 nm.

11. The precursor of claim 7, wherein the polymer has infra-red absorbing groups which are residues of polymethine dyes or cyanine dyes.

12. The precursor of claim 7, wherein the polymer comprises: (i) at least one functional group independently selected from —SO$_2$NHR, —NHR, —SH and —OH, where R represents a hydrogen atom or a C$_{1-4}$ alkyl group; and (ii) at least one pendent group which absorbs infra-red radiation.

* * * * *